United States Patent [19]
Hardee et al.

[11] Patent Number: 5,321,324
[45] Date of Patent: Jun. 14, 1994

[54] LOW-TO-HIGH VOLTAGE TRANSLATOR WITH LATCH-UP IMMUNITY

[75] Inventors: Kim C. Hardee; Kenneth J. Mobley, both of Colorado Springs, Colo.

[73] Assignees: United Memories, Inc., Colorado Springs, Colo.; Nippon Steel Semiconductor Corporation, Chiba, Japan

[21] Appl. No.: 10,342

[22] Filed: Jan. 28, 1993

[51] Int. Cl.$^5$ .............................. H03K 17/10
[52] U.S. Cl. ............................ 307/475; 307/451
[58] Field of Search ............... 307/443, 451, 475, 264; 365/189.09

[56] References Cited

U.S. PATENT DOCUMENTS

| | | | |
|---|---|---|---|
| 4,698,526 | 10/1987 | Allan | 307/475 |
| 4,820,941 | 4/1989 | Dolby et al. | 307/475 X |
| 4,845,381 | 7/1989 | Cuevas | 307/475 X |
| 4,920,284 | 4/1990 | Denda | 307/475 |
| 5,136,190 | 8/1992 | Chern et al. | 307/475 |

OTHER PUBLICATIONS

Foss et al., "Application of a High-Voltage Pumped Supply for Low-Power DRAM," *1992 Symposium on VLSI Circuits Digest of Technical Papers,* vol., 11-1, pp. 106-107 (1992).

*Primary Examiner*—David R. Hudspeth
*Attorney, Agent, or Firm*—Edward D. Manzo; David K. Lucente

[57] ABSTRACT

A fast low-to-high voltage translator with immunity to latch-up. The circuit includes a voltage comparator and employs at least one transistor which is used to quickly pull up a node. If further uses another transistor which is capable of limiting the voltage at certain nodes in order to eliminate latch-up if a pumped power supply is provided to the circuit. Latch-up therefore is eliminated during power-up. Other transistors are utilized as voltage drop limiters to limit the voltage drop across other transistors during switching. This provides improved reliability by reducing substrate current and hot carriers.

21 Claims, 4 Drawing Sheets

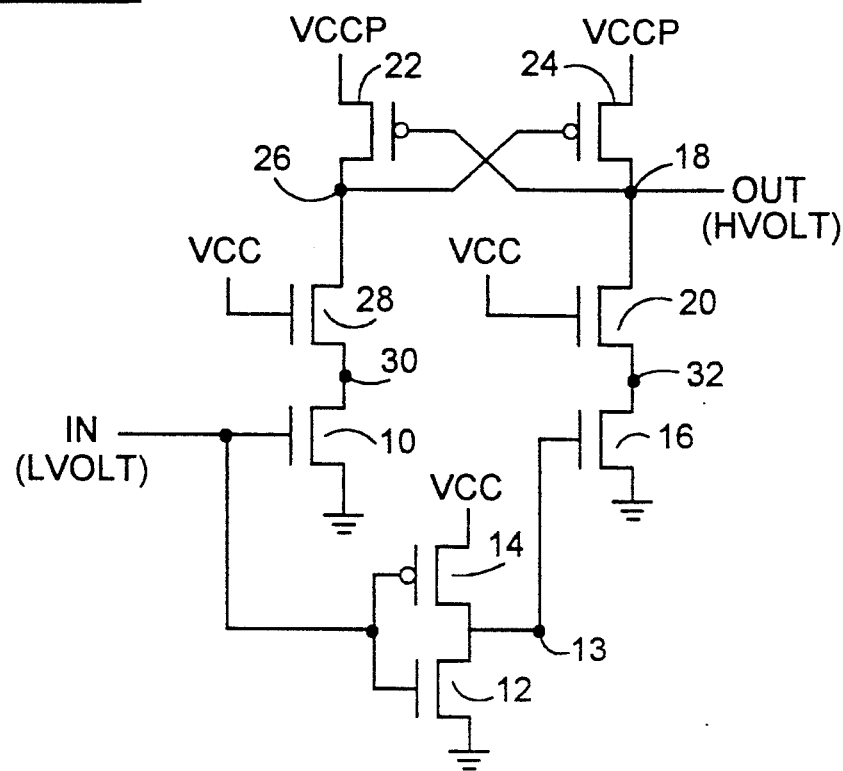
PRIOR ART FIG. 1
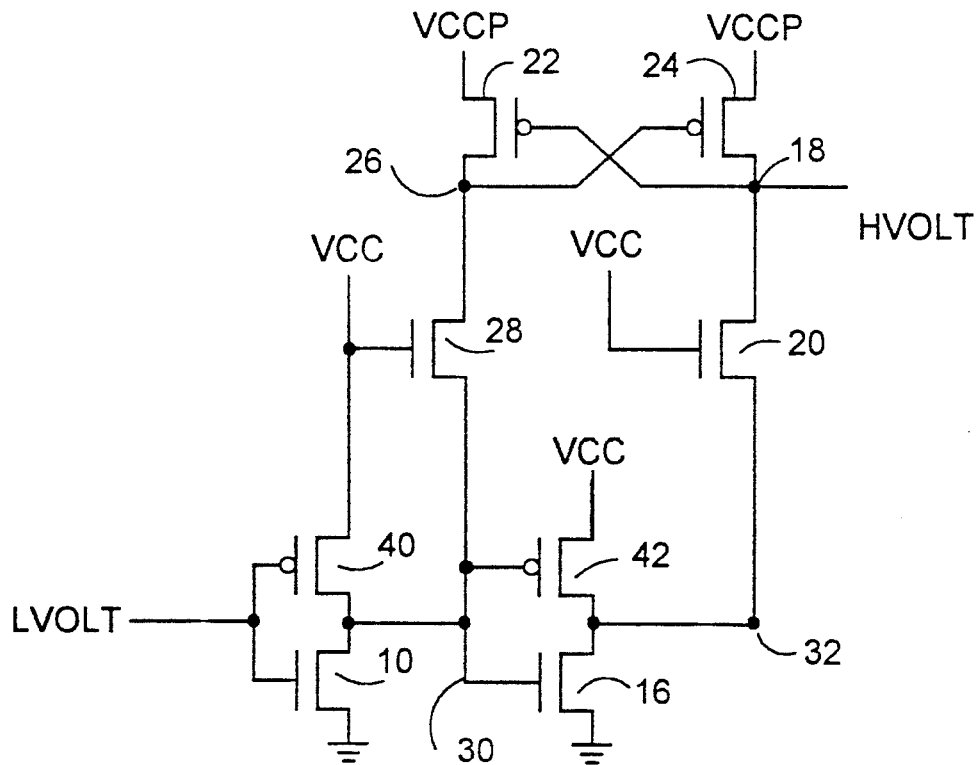
FIG. 2

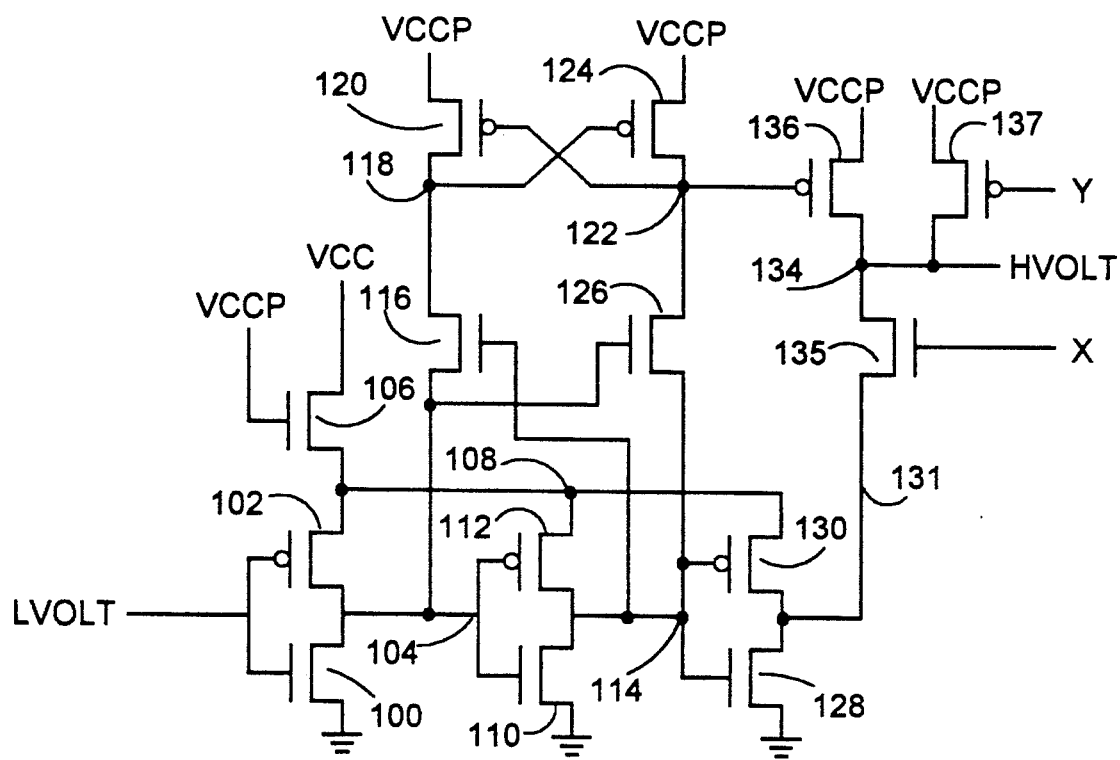

LOW-TO-HIGH VOLTAGE TRANSLATOR WITH LATCH-UP IMMUNITY

FIELD OF THE INVENTION

The present invention relates to a voltage converter and more particularly to a fast low-to-high voltage transistor having latch-up immunity.

BACKGROUND OF THE INVENTION

With the trend of scaling down devices for higher density, many integrated circuits have both low and high voltage requirements. The low voltage is required for normal operation of the circuit. Other operations of the circuit require the higher voltage. This higher voltage may, for example, be used to write, restore, or refresh a high voltage stored in a memory cell. The power supply providing the high voltage may be a pumped voltage supply, or may be provided externally. An example of such an integrated circuit is a complementary metal oxide semiconductor ("CMOS") dynamic random access memory ("DRAM"). Typical low and high voltages are 3V and 5V, respectively.

FIG. 1 is a schematic diagram of a circuit that converts a low voltage signal varying between 0V and VCC (e.g. 3V) to a high voltage signal varying between 0V and VCCP (e.g. 5V). Briefly, gate electrodes of transistors 10, 12 and 14 are coupled to receive an input signal IN. VCC is coupled to ground (typically 0V) through a series source-drain path of complementary transistors 12 and 14. A node 13 is located at the drain electrodes of transistors 12 and 14. Node 13 is coupled to a gate electrode of a transistor 16.

A node 18 is coupled to ground through source-drain paths of series transistors 16 and 20. A gate electrode of transistor 20 is coupled to receive VCC. Node 18 is coupled to a gate electrode of a P-channel transistor 22. VCCP is coupled to node 18 through a source-drain path of a P-channel transistor 24. A gate electrode of transistor 24 is coupled to a node 26. The bodies (or N-wells) of transistors 22 and 24 are connected to VCCP.

Node 26 is coupled to VCCP through a source-drain path of transistor 22. Node 26 is coupled to ground through source-drain paths of series transistors 28 and 10. A node 30 is coupled to the drain electrode of transistor 10. A gate electrode of transistor 28 is coupled to receive VCC. A node 32 is coupled to the drain electrode of transistor 16 and the source electrode of transistor 20. An output signal OUT is provided at node 18.

Transistors 12 and 14 form an inverter. When the signal IN is supplied to transistors 12 and 14, the voltage at node 13 is the opposite state of the signal IN. For example, if a voltage of signal IN is VCC, then the voltage at node 13 is 0V.

Referring to the operation of the FIG. 1 circuit, when signal IN is VCC, transistor 10 is turned on to pull node 30 to 0V. Since transistor 28 is configured to be on (its gate-source voltage is greater than a threshold voltage $Vt_N$ drop), node 26 will be pulled to 0V through the source-drain path of transistor 10.

Transistors 12 and 14 invert the high signal IN to provide 0V at node 13. Since this is coupled to the gate electrode of transistor 16, it turns off. Thus node 18 is not pulled to 0V through the source-drain path of transistor 20. However, node 26 provides 0V to the gate electrode of transistor 24 to turn it on (the gate-source voltage is more negative than a threshold voltage $Vt_p$). The source-drain path of transistor 24 pulls node 18 to VCCP.

Meanwhile, node 18 supplies VCCP to the gate electrode of transistor 22. The gate-source voltage is not less than a threshold voltage $Vt_p$, so transistor 22 is turned off. Node 26 is pulled closer to 0V. The output signal OUT provided at node 18 is VCCP.

When the voltage of signal IN is 0V, it turns off transistor 10 and unclamps nodes 26 and 30 from 0V. The 0V of the signal IN is inverted by transistors 12 and 14 to provide VCC to the gate of transistor 16. Transistor 16 is turned on to pull nodes 18 (through turned-on transistor 20) and 32 to 0V.

Node 18 provides 0V to the gate electrode of transistor 22 to turn it on (the gate-source voltage is more negative than a threshold voltage $Vt_p$). As a result, node 26 is clamped to VCCP, which is coupled to the gate electrode of transistor 24. Transistor 24 is thereby turned off since the gate-source voltage is more negative than a threshold voltage $Vt_p$. Thus, node 18 is pulled closer to 0V. Output signal OUT provided by node 18 is 0V.

The circuit shown in FIG. 1 suffers from slow speed since nodes 30 and 32 cannot be quickly pulled to VCC because they are not directly coupled to VCC. Pulling nodes 30 and 32 to VCC would speed up the transition of respective nodes 26 and 18 to VCCP.

Therefore, it is a general object of the present invention to overcome the above problems.

The further object of the present invention is to minimize current flow from a power supply providing VCCP to another potential, such as ground.

SUMMARY OF THE INVENTION

The present invention provides a fast low-to-high voltage translator with latch-up immunity. The circuit includes a voltage comparator which compares an input voltage to its complement. It is coupled to receive a low power supply (VCC) and a high power supply (VCCP). The high voltage supply (VCCP) may be a pumped power supply. The output of this circuit may be buffered to provide logic functions, and to drive large loads.

A novel and important aspect of the present invention is that it provides high-speed switching with latch-up immunity when implemented with a pumped power supply.

A salutary aspect of the present invention is that it minimizes the current between the high voltage supply and ground.

BRIEF DESCRIPTION OF THE DRAWINGS

The invention, together with its objects and the advantages thereof, may best be understood by reference to the following detailed description taken in conjunction with the accompanying drawings, of which:

FIG. 1 is a detailed diagram of a prior art circuit that translates a low voltage to a high voltage;

FIG. 2 is schematic diagram of a first embodiment of the present invention;

FIG. 6 is a modification of the FIG. 4 embodiment.

DETAILED DESCRIPTION OF THE PREFERRED EMBODIMENTS

Figure 3:
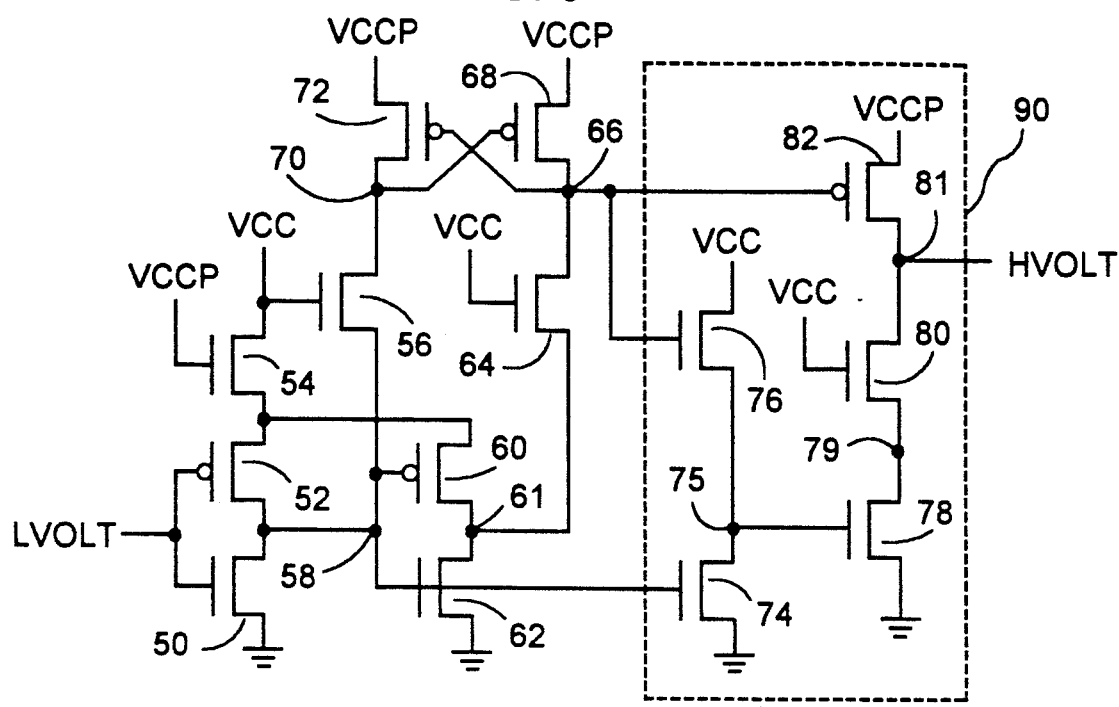
FIG. 3 shows a second embodiment of the present invention.

FIG. 2 illustrates an improvement over the FIG. 1 circuit. Like devices and nodes of FIGS. 1 and 2 will be designated with the same numbers. Nodes 30 and 32 are coupled to VCC through source-drain paths of transistors 40 and 42, respectively. Transistors 12 and 14 have been eliminated. The gate electrodes of transistors 16 and 42 are directly coupled to node 30. The gate electrodes of transistors 10 and 40 are coupled to receive signal LVOLT.

Transistors 10 and 40 form a first inverter, and transistors 16 and 42 form a second inverter. Each inverter is coupled between VCC and ground (0V). Whatever the voltage of an input signal LVOLT, the inverted or opposite voltage will be provided on node 30 by transistors 10 and 40. The voltage at node 32 will be provided by transistors 16 and 42 as the same voltage as signal LVOLT.

When the voltage of signal LVOLT is VCC, the respective voltages at nodes 30 and 32 are 0V and VCC. Node 26 is clamped to 0V through turned-on transistor 28. Node 18 is pulled to $VCC-Vt_N$ through turned-on transistor 20. Node 26 supplies 0V to the gate electrode of transistor 24 to turn it on harder (the gate-source voltage is more negative than a threshold voltage $Vt_p$). This pulls node 18 to VCCP and turns off transistor 20.

Node 18 first provides $VCC-Vt_N$ to the gate electrode of transistor 22 to decrease its current drive capability and then provides VCCP to the gate electrode of transistor 22 to turn it off completely. Node 26 is pulled further to 0V. Output signal HVOLT supplied by node 18 is approximately VCCP.

When the voltage of signal LVOLT is 0V, the respective voltages at nodes 30 and 32 are VCC and 0V. Node 18 is clamped to 0V through turned-on transistor 20. Node 26 is pulled to $VCC-Vt_N$ through turned-on transistor 28. When the voltage at node 26 rises to $VCC-Vt_N$ transistor 28 will turn off. Node 18 supplies 0V to the gate electrode of transistor 22 to turn it on harder (the gate-source voltage is more negative than a threshold voltage $Vt_p$). This pulls node 26 to VCCP.

Node 26 first provides $VCC-Vt_N$ to the gate electrode of transistor 24 to decrease its current drive capability and then provides VCCP to turn off transistor 24 completely. Node 18 is then pulled closer to 0V. Output signal HVOLT is supplied by node 18 and has a voltage of approximately 0V.

Transistors 20 and 28 are used to limit the drain-to-source voltages across transistors 16 and 10, respectively, to $VCC-Vt_N$ during switching. For example, if transistor 22 is on (the gate-source voltage of transistor 22 is more negative than or equal to $Vt_p$), the voltage at node 26 is VCCP. If transistor 28 is eliminated and transistor 10 is on (the voltage of signal LVOLT is high at the gate electrode of transistor 10), there would be a voltage drop across transistor 10 equal to VCCP−VSS (>VCC). This voltage drop may cause substrate current and hot carriers if the device has small dimensions which may permanently damage the transistor.

Transistors 20 and 28 also eliminate the latch-up of transistors 42 and 40, respectively. For example, if transistor 22 is on (the gate-source voltage of transistor 22 is more negative than or equal to $Vt_p$), the voltage at node 26 is VCCP. If transistor 28 were eliminated, the voltage at the drain electrode of transistor 40 would be VCCP. If the substrate of transistor 40 were coupled to receive VCC, then the drain-substrate region of transistor 40 would be forward biased. The forward bias may cause transistor 40 to latch-up.

The substrate of transistor 40 may be coupled to receive VCCP to eliminate the foregoing problem. However, this causes another problem. During power-up, input signal LVOLT may be 0 V, which will turn turned-on transistor 40 (gate-source voltage is more negative than or equal to $Vt_p$). Node 30 would be pulled to VCC. But, VCCP does not rise as quickly as VCC on power-up, so that VCCP may be a diode voltage drop VD less than VCC. Thus, the drain-substrate voltage VCC−VCCP may cause transistor 40 to latch-up.

The inclusion of transistors 20 and 28 will eliminate these problems. For example, transistor 28 will pass a voltage VCCP (up to a maximum of $VCC-Vt_N$) during power up. Therefore, the drain-substrate region of transistor 40 will not forward bias, even during normal operation, regardless of what voltage the substrate is biased to.

The improvement of the FIG. 2 over the FIG. 1 circuit is that transistors 40 and 42 are coupled to nodes 30 and 32, respectively, to pull them up to VCC quicker. This allows nodes 26 and 18, respectively, to be pulled more quickly to VCCP.

However, the cost of the FIG. 2 circuit speed improvement is that the circuit is susceptible to latch-up if the high power supply VCCP is a pumped power supply. Specifically, upon power-up, VCC may be higher than VCCP because VCCP has not been pumped to its full voltage. VCCP is typically generated from VCC. In the case where the signal LVOLT is low, node 30 will be clamped to VCC since transistor 40 is turned on. Since transistor 28 is on, the voltage at node 26 will be clamped to $VCC-Vt_N$. Node 26 does not reach a full VCC because the transistor will turn off when the voltage at the source electrode rises above $VCC-Vt_N$.

If the voltage at node 26 ($VCC-Vt_N$) is greater by a diode voltage VD than the substrate voltage VCCP (VD is a PN junction diode voltage drop of the drain-substrate region), transistor 22 may latch-up. The reason for the latch-up is that the drain electrode of transistor 22 having a voltage $VCC-Vt_N$ is a P+ region in an N-well (substrate) tied to VCCP. The PN junction will forward bias and current will flow through the substrate. As a result, latch-up may occur.

For example, during power-up, VCC rises from 0 V to 3 V and VCCP is pumped to 5 V, where VCC rises before VCCP. If node 26 rises to a threshold voltage VD greater than VCCP while VCCP is pumping upwards, the PN junction of transistor 22 will forward bias to allow current to flow through the substrate from the drain electrode. The current may cause transistor 22 to latch-up.

FIG. 3 shows a second embodiment of the present invention. A first inverter formed by transistors 50 and 52 has respective gate electrodes coupled to receive an input signal LVOLT. Input signal LVOLT typically varies between 0 V and a first power supply voltage VCC. A source electrode of transistor 50 is coupled to a second power supply or reference voltage providing, for example, a ground potential VSS. VSS is typically 0 V. A drain electrode of transistor 50 is coupled to a drain electrode of transistor 52. A source electrode of transistor 52 is coupled to a source electrode of a transistor 54. A gate electrode of transistor 54 is coupled to a third power supply providing a voltage VCCP. A drain electrode of transistor 54 is coupled to receive VCC.

A gate electrode of a transistor 56 is coupled to receive VCC. A source electrode of transistor 56 is coupled to a node 58. Drain electrodes of transistors 50 and 52 are also coupled to node 58. Node 58 is coupled to gate electrodes of complementary transistors 60 and 62 which are connected as a second inverter. A source electrode of transistor 60 is coupled to source electrodes of transistors 52 and 54. A drain electrode of transistor 60 is coupled to a drain electrode of transistor 62. A source electrode of transistor 62 is coupled to ground. Drain electrodes of transistors 60 and 62 are coupled to a node 61.

Node 61 is coupled to a source electrode of a transistor 64, a gate electrode of which is coupled to receive VCC. A drain electrode of transistor 64 is coupled to a node 66. Node 66 is coupled to a drain electrode of a transistor 68. A gate electrode of transistor 68 is coupled to a node 70. Node 70 is coupled to a drain electrode of transistor 56. Node 70 is also connected to a drain electrode of a transistor 72. A source electrode of transistor 72 is coupled to receive VCCP. A source electrode of transistor 68 is coupled to receive VCCP.

Node 58 (the output of the first inverter) is coupled to a gate electrode of a transistor 74. A source electrode of transistor 74 is coupled to ground. A drain electrode of transistor 74 is coupled to a source electrode of a transistor 76. A gate electrode of transistor 76 is coupled to node 66. A drain electrode of transistor 76 is coupled to receive VCC. The drain electrode of transistor 74 and the source electrode of transistor 76 are coupled to a node 75. Node 75 is coupled to a gate electrode of a transistor 78. A source electrode of transistor 78 is coupled to ground. A drain electrode of transistor 78 is coupled to a node 79. Node 79 is coupled to a source electrode of a transistor 80.

A gate electrode of transistor 80 is coupled to receive VCC. A drain electrode of transistor 80 is coupled to a node 81. Node 81 is coupled to a drain electrode of a transistor 82. A gate electrode of transistor 82 is coupled to node 66. A source electrode of transistor 82 is coupled to receive VCCP. Node 81 provides an output signal HVOLT. Typically, VCCP$\approx$5 V, VCC$\approx$3 V and VSS (ground)$\approx$0 V.

The circuit defined by a block 90 (circuit elements 74 to 82) in FIG. 3 represents a buffered output stage. The purpose of buffered output stage 90 is to drive large capacitive loads. It can be configured to so that signal HVOLT either follows or is the complement of signal LVOLT.

Transistors 72, 68 and 82 are p-channel and have their bodies coupled to the third power supply providing VCCP. Transistors 52 and 60 also are p-channel, but have their bodies coupled to the first power supply providing VCC.

Transistors 56, 64 and 80 are used to limit the drain-to-source voltages across transistors 50, 62 and 78, respectively, to VCC$-$Vt$_N$ during switching. For example, if transistor 72 is on (the gate-source voltage of transistor 72 is less than or equal to Vt$_P$), the voltage at node 70 is VCCP. If transistor 56 were eliminated and transistor 50 is on (from LVOLT being high at the gate electrode of transistor 50), there would be a voltage drop across transistor 50 equal to VCCP$-$VSS($>$VCC). This voltage drop may cause substrate current and hot carriers if the device were to have small dimensions.

Transistors 56 and 64 also function to limit the drain-substrate voltage (i.e. PN junction voltage) of transistors 52 and 60. In the instance where the voltage at node 58 is allowed to increase to VCCP (transistor 56 is eliminated), the drain-substrate voltage drop would be VCCP$-$VCC. This voltage drop is greater than a drain-substrate junction voltage VD. Therefore, the drain-substrate junction will be forward biased and current will be caused to flow into the substrate. As a result, transistor 52 will probably latch-up.

The addition of transistor 56 decreases the voltage drop across turned-on transistor 50. If the voltage at node 70 is VCCP, and the voltage at the gate electrode of transistor 56 is VCC (VCCP$\geq$VCC), then transistor 56 will only pull node 58 to VCC$-$Vt$_N$. Transistor 56 will turn off if the voltage at node 58 rises past VCC$-$Vt$_N$ ($<$VCCP).

To summarize, the inclusion of transistors 56 and 64 will eliminate the problems mentioned supra. For example, transistor 56 will pass a voltage VCCP up to a maximum of VCC$-$Vt$_N$ during power-up. Therefore, the drain-substrate region of transistor 52 will not forward bias, even during normal operation, regardless of what voltage the substrate is biased to.

Transistors 52 and 60 are implemented to speed up the operation of this preferred embodiment by coupling nodes 58 and 61 to VCC. However, transistor 54 is added to avoid latch-up during power-up of the circuit by preventing nodes 66 and 70 from rising above VCCP$-$Vt$_N$. Similar to the explanation of FIG. 2, if the source electrode of transistor 52 were coupled directly to receive VCC (transistor 54 removed), then on power-up the voltage at node 58 would be VCC if signal LVOLT were low (0 V). Turned-on transistor 56 will couple node 70 to VCC$-$Vt$_N$. Node 70 cannot rise to a greater voltage because transistor 56 will turn off. If the voltage at node 70 were a diode voltage VD greater than VCCP, the PN drain region may forward bias which would inject current into the substrate. This may cause latch-up.

By adding transistor 54 to the FIG. 3 embodiment (as illustrated), the voltage at the source electrode will be regulated to VCCP$-$Vt$_N$ until VCCP is a threshold greater than VCC. At that point, the source electrode will not increase past VCC. Thus the voltage at node 58 will be VCCP$-$Vt$_N$ up to a maximum of VCC. Transistor 56 will clamp node 70 (transistor 72 is off) to a maximum of VCC$-$Vt$_N$. Node 70 cannot rise above VCC$-$Vt$_N$ since transistor 56 will turn off. The voltage at node 70 will be VCCP$-$Vt$_N$ up to a maximum of VCC$-$Vt$_N$. The drain-substrate voltage will not forward bias the drain-source region. Transistor 72 will not latch-up.

The function of transistor 54 will be explained by way of an example. During power-up, VCCP=2 V, VCC=3 V, Vt$_N$=1 V, VD=0.5 V, and LVOLT=0 V. The voltage at the source electrode of transistor 54 equals VCCP$-$Vt$_N$=1 V. Since transistor 52 is turned on by signal LVOLT (0 V), the voltage at node 58 equals 1 V. VCC at the gate electrode of transistor 56 allows node 70 to be clamped to 1 V. Since the PN drain region has a voltage from the drain electrode to the substrate of 1 V$-$2 V=$-$1 V ($<$VD), the PN drain region is not forward biased. No latch-up occurs.

As another example, consider these conditions: VCCP=5 V, VCC=3 V, Vt$_N$=1 V, VD=0.5 V, and LVOLT=0 V. The voltage at the gate electrode of transistor 54 is greater than a threshold voltage Vt$_N$ above VCC. Therefore, the full voltage VCC at the drain electrode of transistor 54 will be passed to the source electrode of transistor 54. Signal LVOLT turns turned-on transistor 52 to clamp node 58 to VCC. Transistor 56 will clamp node 70 only to VCC−$Vt_N$ since the voltage at the gate electrode of transistor 56 is VCC. Since the PN drain region has a voltage from the drain electrode to the substrate of VCC−VCCP=−2 V (<VD), the PN drain region is not forward biased. No latch-up occurs.

Transistors 76 and 74 comprise a push-pull stage which prevents crowbar current from passing from VCCP to VSS of the buffered output stage. "Crowbar" current is current from a high voltage supply to a low voltage supply during device switching. Transistor 74 is larger than transistor 76 so that node 75 is pulled low before node 66 is pulled low, thereby turning off transistor 78 before transistor 82 turns on. This prevents current from VCCP to ground through the source-drain paths of transistors 78, 80 and 82.

When the voltage at node 66 rises to VCCP, node 75 rises to VCC through the source-drain path of transistor 76, but only after a delay due to the small size of transistor 76 and a VTN drop. Therefore, transistor 82 turns off before transistor 78 turns on. Again, this prevents current from VCCP to ground through the source-drain paths of transistors 78, 80 and 82.

The operation of the FIG. 3 embodiment will now be explained. When the input signal LVOLT is VCC, transistor 52 is turned off and transistor 50 is turned on. Turned-on transistor 50 pulls node 58 to ground (0 V). Since the voltage at the gate electrode of transistor 56 is VCC and the voltage at the source electrode of transistor 56 is 0 V, transistor 56 is turned on to pull node 70 to ground.

The low voltage (0 V) at node 58 turns turned-on transistor 60 and turns off transistor 62. Node 61 is pulled up to VCC trough turned-on transistors 54 and 60. Since the voltage at the gate electrode of transistor 64 is VCC, and the voltage at the electrode of transistor 64 (node 61) is being pulled to VCC, transistor 64 is on until node 66 rises to VCC−$Vt_N$. At this point, transistor 64 is either off or barely on to maintain the voltage at node 66. The 0 V at node 79 is supplied to the gate electrode of transistor 68 to turn it on harder. The voltage at node 66 rises to VCCP. Transistor 64 is turned off.

VCCP at node 66 is applied to the gate electrode of transistor 72. Since the voltage at node 66 is increasing to VCCP and the voltage at the source electrode is VCCP, transistor 72 eventually turns off and node 70 is pulled further to ground.

The 0 V at node 58 is also supplied to the gate electrode of transistor 74 which is turned off. VCCP at node 66 is applied to transistor 76 to turn it on and pull node 75 to VCC. VCC at node 75 turns turned-on transistor 78 to pull node 79 to ground.

Since the voltage at the gate electrode of transistor 80 is greater than the voltage at its source electrode (0 V), transistor 80 is turned on to pull the voltage at node 81 to ground. Thus, the output signal HVOLT is 0 V.

VCCP at node 66 is applied to the gate electrode of transistor 82. Since transistor 82 is a p-channel device, and the voltage at its source electrode is VCCP, transistor 82 is not turned on. This route from node 81 to VCCP is thus broken.

When the input signal LVOLT is 0 V, transistor 50 is turned off and transistor 52 is turned on. Turned-on transistor 52 pulls node 58 to VCC which is provided through turned-on transistor 54 (the gate-source voltage is greater than $Vt_N$). Since the voltage at the gate electrode of transistor 56 is VCC, and the voltage at node 58 is being pulled to VCC, node 70 is pulled to VCC−$Vt_N$. At this point, transistor 56 is either off or barely on to maintain VCC−$Vt_N$ at node 70. Since the gate electrode voltage of transistor 68 has increased, the current drive capability of transistor 68 is decreased, thus lowering the voltage at node 66.

VCC at node 58 turns turned-on transistor 62 and turns off transistor 60. The voltage at node 61 is pulled down to 0 V. This 0 V at the source electrode of transistor 64 is less than the voltage at its gate electrode (VCC), therefore transistor 64 is turned on to pull node 66 down to 0 V. 0 V at node 66 is applied to the gate electrode 72, which is less than voltage (VCCP) at the source electrode of transistor 72. Transistor 72 is turned on to conduct more current and therefore node 70 is pulled to VCCP, and transistor 56 is turned off. VCCP at node 70 is applied to the gate electrode of transistor 68. The gate and source electrodes of transistor 68 have the voltage VCCP. Transistor 68 is turned off. Node 66 is pulled to ground.

VCC at node 58 turns turned-on transistor 74 which in turn couples node 75 to 0 V. 0 V at node 66 turns off transistor 76 to decoupled node 75 from VCC. 0 V at node 75 turns off transistor 78. Hence, node 81 is not pulled down to 0 V. The low voltage at node 66 is applied to the gate electrode of transistor 82. Since the gate-source voltage of transistor 82 is more negative than $Vt_p$, transistor 82 is turned on more to conduct more current. Node 81 is pulled up to VCCP. Output signal HVOLT increases to VCCP.

Figure 4:
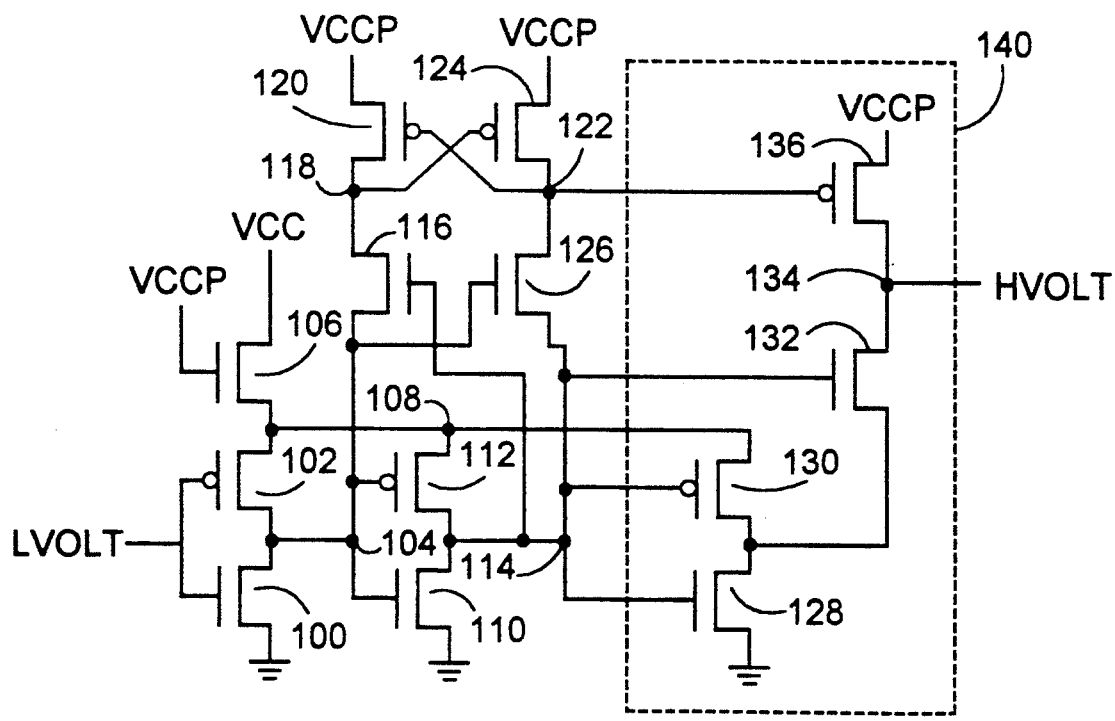
FIG. 4 shows a third embodiment of the present invention.

FIG. 4 illustrates a third embodiment of the present invention. An input signal LVOLT is coupled to a first inverter, specifically to the gate electrodes of complementary transistors 100 and 102. Input signal LVOLT typically varies between 0 V and VCC. A source electrode of transistor 100 is coupled to receive ground potential VSS. A drain electrode of transistor 100 is coupled to a drain electrode of transistor 102 at node 104. A source electrode of transistor 102 is coupled to a drain electrode of a transistor 106 at a node 108. A gate electrode of transistor 106 is coupled to receive VCCP. A drain electrode of transistor 106 is coupled to receive VCC.

Node 104 (the output of the first inverter) is coupled to gate electrodes of a second inverter formed by complementary transistors 110 and 112. The first and second inverters are coupled between node 108 and ground. Thus, a source electrode of transistor 110 is coupled to ground, drain electrodes of transistors 110 and 112 are coupled together, and a source electrode of transistor 112 is coupled to node 108. Drain electrodes of transistors 110 and 112 are coupled to a node 114 which is the output of the second inverter.

Node 104 from the first inverter is coupled to a source electrode of a transistor 116. A gate electrode of transistor 116 is coupled to node 114. A drain electrode of transistor 116 is coupled to a node 118. Node 118 is coupled to a drain electrode of a p-channel transistor 120. A gate electrode of a transistor 120 is coupled to a node 122. A source electrode of transistor 120 is coupled to receive VCCP, which is also coupled to the body of transistor 120.

Node 118 is coupled to a gate electrode of a p-channel transistor 124. A source electrode of transistor 124 is coupled to receive VCCP. A drain electrode of transistor 124 is coupled to node 122. Node 122 is coupled to a drain electrode of a transistor 126. A gate electrode of a transistor 126 is coupled to node 104. A source electrode of a transistor 126 is coupled to node 114.

Node 114 is coupled to gate electrodes of a third inverter between node 108 and ground. The third inverter comprises transistors 128 and 130 having an output node 132. A source electrode of transistor 128 is coupled to ground. Drain electrodes of transistors 128 and 130 are coupled together. A source electrode of transistor 130 is coupled to node 108. Drain electrodes of transistors 128 and 130 are coupled to a source electrode of a transistor 132. A gate electrode of transistor 132 is coupled to node 114. A drain electrode of transistor 132 is coupled to a node 134.

Node 134 is coupled to a drain electrode of a transistor 136. A gate electrode of transistor 136 is coupled to node 122. A source electrode of transistor 136 is coupled to receive VCCP. A signal HVOLT is provided at node 134.

The circuit defined by a block 140 (elements 128 to 136) in FIG. 4 represents a buffered output stage. The purpose of the buffered output stage is to drive large capacitive loads. It can be configured to so that signal HVOLT either follows or is the complement of signal LVOLT. Transistors 116, 126 and 132 serve the same functions as transistors 56, 64 and 80 of FIG. 3. Additionally, their respective gate electrodes are not connected to VCC, but are connected to active nodes within the FIG. 4 embodiment. This configuration is done to increase the switching speed and to reduce crowbar current (explained infra).

P-channel transistors 120, 124 and 136 have their bodies coupled to the third power supply providing VCCP. Transistors 102, 112 and 130 have their bodies coupled to the first power supply providing VCC.

The operation of the FIG. 4 embodiment will now be explained. When the input signal LVOLT is VCC, transistor 100 is turned on to clamp node 104 to 0 V. Transistor 102 is turned off. With VCCP being applied to the gate electrode of transistor 106 to maintain it on, node 108 is clamped to VCC since transistor 102 is off.

With 0 V at node 104, transistor 110 turns off and transistor 112 turns on to clamp node 114 to VCC. Therefore, the voltage at node 114 is the inverse or complement of the voltage at node 104. VCC at node 114 and 0 V at node 104 are respectively applied to the gate and source electrodes of transistor 116. Transistor 116 is turned on since the gate-source voltage is greater than a threshold voltage $Vt_N$. Turned-on transistor 116 pulls the voltage at node 118 to 0 V (assuming transistor 120 is off).

VCC at node 114 and 0 V at node 104 are respectively applied to the source and gate electrodes of n-channel transistor 126. Transistor 126 is turned off since the the gate-source voltage is less than a threshold voltage $Vt_N$. Hence, node 122 is decoupled from node 114.

0 V at node 118 is applied to the gate electrode of transistor 124. The gate-source voltage of transistor 124 (0 V−VCCP) causes transistor 124 to turn on. The voltage at node 122 is clamped to VCCP since node 122 is not coupled to any other node. VCCP at node 122 is applied to the gate electrode of transistor 120. Transistor 120 is turned off because the gate-source voltage (VCCP−VCCP) is less negative than one threshold voltage $Vt_P$. Accordingly, node 118 is coupled to ground via the source-drain path of transistor 100, and neither transistor 102 nor 120 pull voltage up.

VCCP at node 122 is applied to the gate electrode of transistor 136. Since the gate-source voltage of transistor 136 (VCCP−VCCP) is less negative than a threshold voltage $Vt_P$, transistor 136 is turned off to isolate node 134 from VCCP.

VCC at node 114 turns turned-on transistor 128 and turns off transistor 130. Turned-on transistor 128 clamps the voltage at the source electrode of transistor 132 to 0 V. With VCC at node 114 being applied to the gate electrode of transistor 132, transistor 132 is turned on to clamp the voltage at node 134 to 0 V. Hence, signal HVOLT is 0 V.

When signal LVOLT is 0 V, transistor 100 is turned off, thereby to decouple node 104 from ground. Transistor 102 is turned on. Node 108 is coupled to VCC for reasons explained supra (VCCP at gate electrode of transistor 106 maintains it on; drain coupled to VCC). Thus, node 108 is clamped to VCC since transistor 100 is off. Further, turned-on transistor 102 clamps the voltage at node 104 to the voltage at node 108 (VCC).

VCC at node 104 turns transistor 110 on and turns transistor 112 off to clamp the voltage at node 114 to 0 V. 0 V at node 114 and VCC at node 104 are respectively applied to the gate and source electrodes of transistor 116. Transistor 116 is turned off since the gate-source voltage is less than a threshold voltage $Vt_N$. Off transistor 116 decoupled node 118 from node 104.

0 V at node 114 and VCC at node 104 are respectively applied to the source and gate electrodes of transistor 126. Transistor 126 is turned on since its gate-source voltage is greater than one threshold voltage $Vt_N$. This couples node 122 to node 114 and the voltage at node 122 thereby pulling toward 0 V.

0 V at node 122 is applied to the gate electrode of transistor 120. The gate-source voltage of transistor 120 (0 V−VCCP) causes transistor 120 to turn on. The voltage at node 118 is clamped to VCCP since node 118 is not coupled to any other node (transistor 116 is off). VCCP at node 118 is applied to the gate electrode of transistor 124. Transistor 124 is turned off because the gate-source voltage (VCCP−VCCP) is less negative than one threshold voltage $Vt_P$. Since there is no path coupling node 122 to VCC or VCCP, the voltage at node 122 drops to 0 V (at node 114).

Further, the 0 V at node 122 is applied to the gate electrode of transistor 136. Since the gate-source voltage of transistor 136 (0 V−VCCP) is more negative than a threshold voltage $Vt_P$, transistor 136 is turned on to pull node 134 toward VCCP.

The 0 V at node 114 is inverted by transistor 128 and transistor 130 so that the output node 131 of that third inverter rises to VCC. With 0 V at node 114 being applied to the gate electrode of transistor 132, transistor 132 is turned off. Hence, the voltage of the output signal HVOLT is VCCP, supplied via transistor 136.

Transistors 116, 126 and 132 serve the same functions as transistors 56, 64 and 80 of FIG. 3. Additionally, their respective gate electrodes are not connected to VCC, but are connected to active nodes within the FIG. 4 embodiment. This allows transistors 116, 126 and 132 to switch faster than if their gate electrodes were coupled to VCC.

For example, if the gate electrode of transistor 116 were coupled to VCC, then transistor 116 would turn on whenever the voltage at node 104 drops from VCC to 0 V. Transistor 116 would turn off when the voltage at node 104 rises from 0 V to VCC.

As illustrated in FIG. 4 embodiment, the gate electrode of transistor 116 is coupled to node 114. The voltage at node 114, explained supra, is the inverse or complement of the voltage at node 104. When node 104 changes from 0 V to VCC, node 114 changes from VCC to 0 V. With the voltages at the gate and source electrodes of transistor 116 changing at approximately the same time, transistor 116 will turn off more quickly. When the voltage at node 104 changes from VCC to 0 V, and the voltage at node 114 changes from 0 V to VCC, transistor 116 turns on quickly. Transistor 126 and 132 operate in a like manner.

The quick switching of transistors 116, 126 and 132 reduces the crowbar current. For the case where the input signal LVOLT rises from 0 V to VCC, node 104 changes from VCC to 0 V while node 114 changes from 0 V to VCC. This quickly turns transistors 116 and 126 on and off, respectively. Node 118 will change to 0 V and node 122 will be unclamped from 0 V. The quickly decreasing voltage at node 118 will turn turned-on transistor 124 to clamp node 122 to VCCP. At substantially the same time, the quickly increasing voltage at node 122 turns off transistor 120, which then unclamps the voltage at node 118 from VCCP. Node 118 will be pulled further to 0 V. It should be understood that due to the device delays of transistors 100, 102, 110, 112, 116, 120, 124 and 126, transistors 100 and 110 switch before transistor 126 and 124 switch. Therefore, turning transistors 116, 120, 124 and 126 on and off quickly reduces the amount of crowbar current from VCCP to ground through transistors 100 and 110.

Additionally, due to the delay of the devices in the FIG. 4 embodiment, node 114 changes state before node 122. In the instance where node 114 and 122 drop to 0 V, node 114 transitions to 0 V first to turn off transistor 128 before node 122 transitions to 0 V to turn turned-on transistor 136. This timing greatly reduces the crowbar current from VCCP to ground through transistors 128, 132 and 136.

The reduction of the crowbar current is an important advantage of this invention. It is well known in the art that increasing a device's size will increase its speed. However, it must be understood that when using a pumped voltage supply, the user is constrained as to how much current can be drawn from the pumped supply. If a designer were to increase the device sizes, more current would be removed from the pumped voltage source. This in turn will reduce the pumped voltage.

Utilizing the present invention will reduce the crowbar current to the extent that a designer may use larger devices without the worry of drawing too much current from the pumped voltage supply and the attendant problem of reducing the voltage of the pumped supply.

Figure 5A:
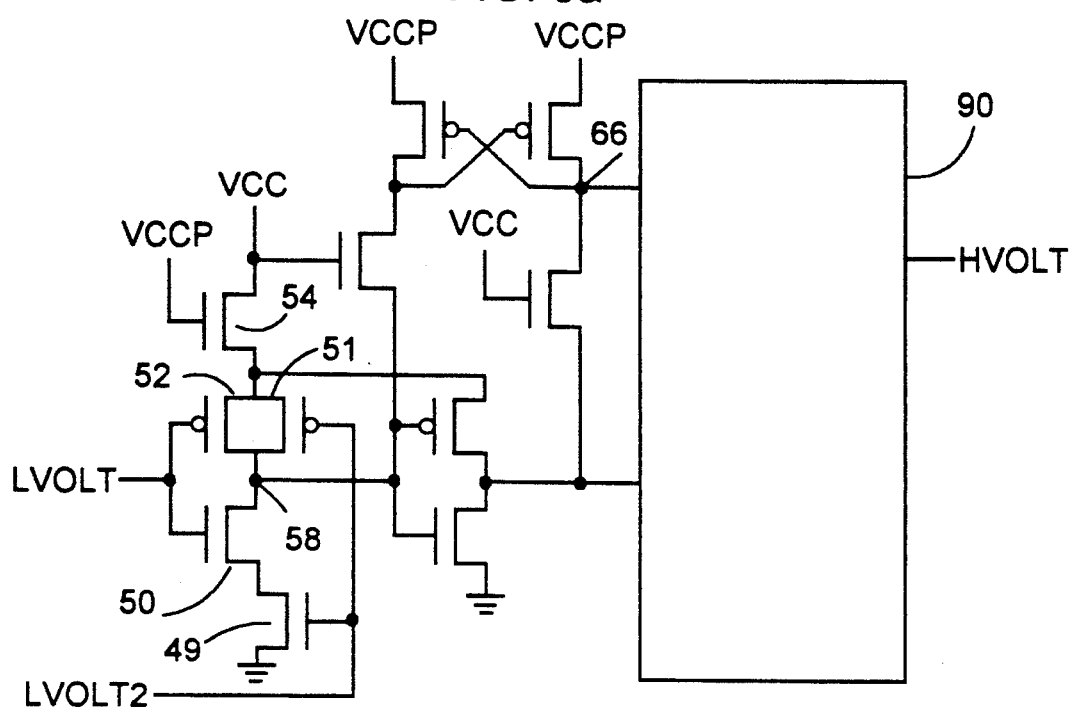
FIGS. 5(*a*) and (*b*) are modifications of the FIG. 3 embodiment.
Figure 5B:
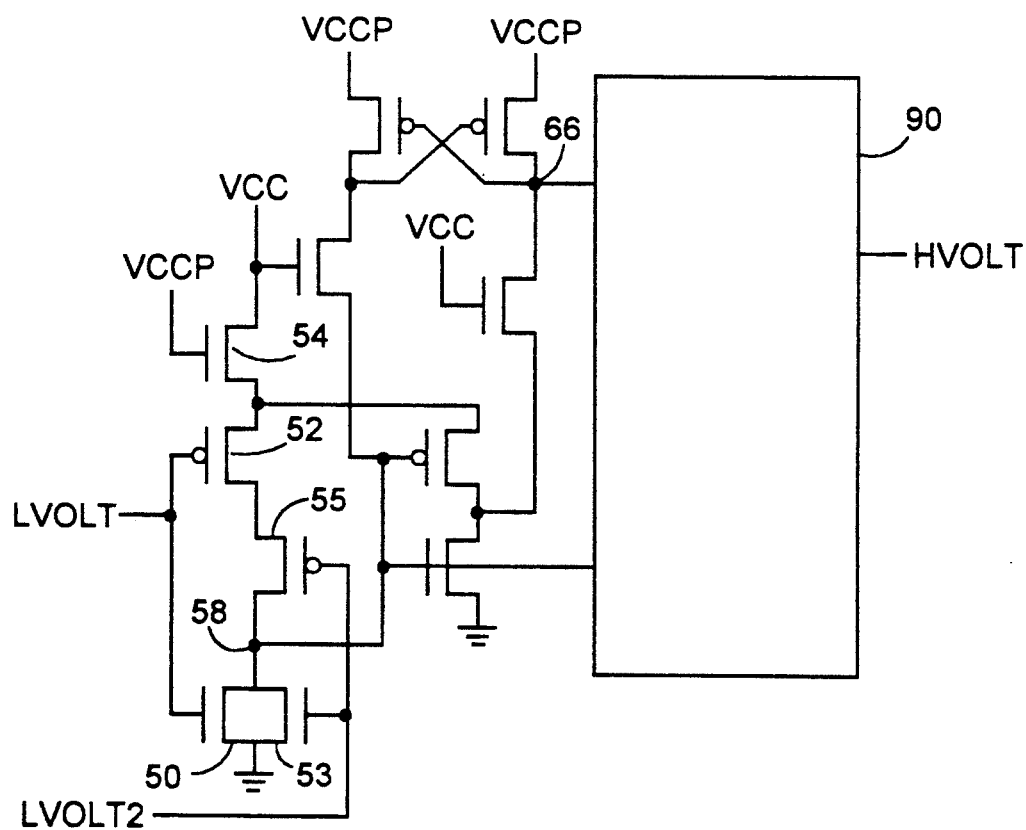

Modifications can be made to the FIG. 3 embodiment to obtain logic functions as illustrated by FIGS. 5 (a) and (b). For example, a source-drain path of a p-channel transistor 51 can be coupled in parallel with transistor 52 between node 58 and the source electrode of transistor 54. A source-drain path of an n-channel transistor 49 can be coupled in series with transistor 50 between node 58 and ground as illustrated in FIG. 5 (a). Another input signal LVOLT2 is coupled to both gate electrodes of the additional p- and n-channel transistors as shown in FIG. 5 (a). This configuration would provide a logic AND function at node 66 and a logic NAND function as the output signal HVOLT. Table 1 shows the input-output characteristics of FIG. 5 (a).

TABLE 1

| FIG. 5 (a) AND/NAND GATE | | | |
|---|---|---|---|
| LVOLT | LVOLT2 | NODE 66 | HVOLT |
| 0 V | 0 V | 0 V | VCCP |
| 0 V | VCC | 0 V | VCCP |
| VCC | 0 V | 0 V | VCCP |
| VCC | VCC | VCCP | 0 V |

Referring to FIG. 5 (b), a source-drain path of a p-channel transistor 55 can be coupled in series with transistor 52 between node 58 and the source electrode of transistor 54. A source-drain path of an n-channel transistor 53 can be coupled in parallel with transistor 50 between node 58 and ground. Another input signal is coupled to both gate electrodes of the additional p- and n-channel transistors as shown in FIG. 5 (b). Table 2 shows the input-output characteristics of FIG. 5 (b).

TABLE 2

| FIG. 5 (a) OR/NOR GATE | | | |
|---|---|---|---|
| LVOLT | LVOLT2 | NODE 66 | HVOLT |
| 0 V | 0 V | 0 V | VCCP |
| 0 V | VCC | VCCP | 0 V |
| VCC | 0 V | VCCP | 0 V |
| VCC | VCC | VCCP | 0 V |

FIG. 6 illustrates a modification of the FIG. 4 embodiment. Devices that are the same in FIGS. 4 and 6 are designated by the same reference numerals. In FIG. 6, transistor 135 has its gate electrode coupled to another input signal X generated by other circuitry (not shown). A drain electrode of a further transistor 137 is coupled to node 134. A gate electrode is coupled to another input signal Y that is generated by other circuitry (not shown). A source electrode of transistor 137 is coupled to receive VCCP. Signals X and Y may be the identical signal, or they be time delayed relatives of one another, but at some time they preferably have the same logical signal state. However, the range of signal X is 0 V to VCC while the range of signal Y is 0 V to VCCP.

FIG. 6 is configured to output the logical NAND with respect to signals X and Y, and the voltage at node 114. For example, if the voltage at node 114 is VCC, the voltage of signal X is VCC, and the voltage of signal Y is VCCP, then transistor 128 is turned on and transistor 130 is turned off. Turned-on transistor 128 pulls the source electrode of transistor 135 to 0 V. The voltage at node 122 is VCCP which will turn off transistor 136 to unclamp node 134 from VCCP.

Signal X is VCC to turn turned-on transistor 135 to coupled node 134 to the source electrode of transistor 135 which has a voltage of 0 V. Signal Y is at VCCP which turns off transistor 137 to uncoupled node 134 from VCCP. Therefore, the voltage at node 134 is clamped to 0 V. See Table 3 for the input/output characteristics of FIG. 6.

TABLE 3

| FIG. 6 LOGICAL NAND | | | |
|---|---|---|---|
| NODE 114 | X | Y | HVOLT |
| 0 V | 0 V | 0 V | VCCP |
| VCC | 0 V | 0 V | VCCP |
| 0 V | VCC | VCC | VCCP |
| VCC | VCC | VCC | 0 V |

Similar modifications can be made to the FIG. 4 embodiment like the FIG. 3 embodiment as shown in FIGS. 5 (a) and (b). Similar modifications can be made to the FIG. 3 embodiment buffered output stage 90 like the FIG. 4 embodiment buffered output stage 140 as shown in FIG. 6.

Other modifications can be made to present invention. For instance, a power supply that is not pumped may be used to provide VCCP. This would permit the exclusion of transistor 54 from FIG. 3 and transistor 106 from FIG. 4, since latch-up during power up caused by the pumped power would not exist.

It will be understood that the present invention can be implemented with other configurations for buffered output stages 90 (FIG. 3) and 140 (FIG. 4) without departing from the inventive features. It should be appreciated that the foregoing description is directed to preferred embodiments of the present invention, and that numerous modifications or alterations can be made without departing from the spirit or scope of the present invention.

What we claim as the invention is:

1. A voltage translator circuit comprising:
   a first node selectively coupled to a second node;
   a third node selectively coupled to a fourth node;
   a first power supply selectively coupled to said second and fourth nodes;
   a first switch selectively coupling a second power supply to said first node to quickly set a voltage at said first node substantially equal to a voltage of the second power supply;
   a second switch responsively coupled to said first node and selectively coupling said second power supply to said third node;
   an input terminal coupled to receive an input signal and coupled so that a voltage developed at said first node is based at least partially on said input signal; and
   an output terminal coupled to said fourth node to supply an output signal in response to the input signal.

2. The circuit of claim 1 wherein the circuit is configured so that a voltage developed on said third node is based at least partially on the voltage developed on said first node.

3. The circuit of claim 1 further comprising a third switch selectively coupling said first and second nodes together.

4. The circuit of claim 3 further comprising at least another switch selectively coupling said third and fourth nodes together.

5. A voltage translator circuit comprising:
   a first node selectively coupled to a second node;
   a third node selectively coupled to a fourth node;
   a first power supply selectively coupled to said second and fourth nodes;
   a first switch selectively coupled between a second power supply and said first node to quickly set a voltage at said first node substantially equal to a voltage of the second power supply;
   a second switch selectively coupled between said first switch and the second power supply to prevent a latch-up of said first switch;
   an input terminal coupled to receive an input signal and coupled so that a voltage developed at said first node is based at least partially on said input signal; and
   an output terminal coupled to said fourth node to supply an output signal in response to the input signal.

6. The circuit of claim 5 wherein said second switch is controlled by said first power supply.

7. A voltage translator circuit comprising:
   a first node selectively coupled to a second node;
   a third node selectively coupled to a fourth node;
   a first power supply selectively coupled to said second and fourth nodes;
   a first switch selectively coupling a second power supply to said first node to quickly set a voltage at said first node substantially equal to a voltage of the second power supply;
   an inverter coupled between said first and third nodes;
   an input terminal coupled to receive an input signal and coupled so that a voltage developed at said first node is based at least partially on said input signal; and
   an output terminal coupled to said fourth node to supply an output signal in response to the input signal.

8. The circuit of claim 7 wherein said inverter is coupled to said second power supply.

9. A voltage translator circuit comprising:
   a first node selectively coupled to a second node;
   a third node selectively coupled to a fourth node;
   a first power supply selectively coupled to said second and fourth nodes;
   a first switch selectively coupling a second power supply to said first node to quickly set a voltage at said first node substantially equal to a voltage of the second power supply;
   an input terminal coupled to receive an input signal and coupled so that a voltage developed at said first node is based at least partially on said input signal; and
   an output terminal coupled to said fourth node to supply an output signal in response to the input signal; and
   a buffered output stage coupled to at least one of said nodes.

10. A voltage translator circuit comprising:
    a first switch selectively coupling a first power supply to a first node;
    a second switch selectively coupling the first power supply to a second node;
    a third switch selectively coupling a second power supply to a third node;
    an input terminal coupled to receive an input signal and coupled so that voltages developed at said third node and a fourth node are based at least partially on the input signal;
    an output terminal coupled to said second node to output an output signal; and
    an inverter coupled between said third and fourth nodes.

11. A voltage translator circuit comprising:
    a first switch selectively coupling a first power supply to a first node;
    a second switch selectively coupling the first power supply to a second node;
    a third switch selectively coupling a second power supply to a third node;
    a fourth switch coupled between said third switch and said second power supply;

an input terminal coupled to receive an input signal and coupled so that voltages developed at said third node and a fourth node are based at least partially on the input signal; and an output terminal coupled to said second node to output an output signal.

12. The circuit of claim 11 further comprising a buffered output stage coupled to at least said output terminal.

13. The circuit of claim 11 further comprising:
a fifth switch coupled between said first and third nodes; and
a sixth switch coupled between said second and fourth nodes.

14. The circuit of claim 13 wherein said fifth switch is controlled by a voltage at said fourth node and said sixth switch is controlled by a voltage at said third node.

15. The circuit of claim 14 further comprising a buffered output stage coupled to at least said output terminal, said buffered output stage configured to receive at least another signal to provide a logic AND function.

16. A voltage translator circuit comprising:
a first switch selectively coupling a first power supply to a first node;
a second switch selectively coupling the first power supply to a second node;
a third switch selectively coupling a second power supply to a third node;
a fourth switch coupled in parallel to said third switch;
fifth and sixth switches coupled in series between said third node and another power supply;
an input terminal coupled to receive an input signal and coupled so that a voltage developed at said third node is based at least partially on the input signal; and
an output terminal coupled to said second node to responsively output an output signal.

17. A voltage translator circuit comprising:
a first switch selectively coupling a first power supply to a first node;
a second switch selectively coupling the first power supply to a second node;
a third switch selectively coupling a second power supply to a third node;
a fourth switch coupled in series with said third switch;
fifth and sixth switches coupled in parallel between said third node and another power supply;

an input terminal coupled to receive an input signal and coupled so that a voltage developed at said third node is based at least partially on the input signal; and an output terminal coupled to said second node to output an output signal.

18. A voltage translator circuit comprising:
a first transistor selectively coupling a first power supply to a first node;
a second transistor selectively coupling said first power supply to a second node;
third and fourth series-connected transistors coupled between second and third power supplies coupled to receive an input signal, said third and fourth transistors being coupled to a third node;
fifth and sixth series-connected transistors coupled between said second and third power supplies, coupled to said third node and a fourth node, wherein said second node provides an output signal based on to said input signal; and
a seventh transistor coupled between said third transistor and said second power supply.

19. The circuit of claim 18 further comprising:
an eighth transistor coupled between said first and third nodes;
a ninth transistor coupled between said second and fourth nodes; and
a buffered output stage coupled to at least one of said nodes.

20. A method for operating a voltage translator circuit comprising the steps of:
receiving an input signal;
generating a first voltage at a first node in response to said input signal, including selectively coupling the first node to first and second power supplies;
based on the first voltage, generating a second voltage at a second node, including selectively coupling the second node to said first and second power supplies;
developing and limiting a voltage at a third node; and
based at least partially on the second voltage, generating an output signal.

21. The method of claim 20 wherein said developing step includes operating first and second cross-coupled transistors, both receiving the third voltage,
the first transistor selectively coupling the third voltage toward the third node,
the step of generating an output signal being based at least partially by the operation of the second transistor.

* * * * *